(12) United States Patent
Chen et al.

(10) Patent No.: US 8,218,284 B2
(45) Date of Patent: Jul. 10, 2012

(54) APPARATUS FOR INCREASING ELECTRIC CONDUCTIVITY TO A SEMICONDUCTOR WAFER SUBSTRATE WHEN EXPOSURE TO ELECTRON BEAM

(75) Inventors: Zhong-Wei Chen, San Jose, CA (US); Yi Xiang Wang, Fremont, CA (US); Juying Dou, San Jose, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 344 days.

(21) Appl. No.: 12/179,560

(22) Filed: Jul. 24, 2008

(65) Prior Publication Data

US 2010/0019462 A1    Jan. 28, 2010

(51) Int. Cl.
*H01L 21/683* (2006.01)
*B23B 31/28* (2006.01)

(52) U.S. Cl. ........... 361/234; 361/233; 279/128; 279/97
(58) Field of Classification Search .................. 361/234, 361/233; 279/128, 97
See application file for complete search history.

(56) References Cited

U.S. PATENT DOCUMENTS

| | | | |
|---|---|---|---|
| 5,625,526 A * | 4/1997 | Watanabe et al. | 361/234 |
| 6,068,964 A | 5/2000 | Komori | |
| 6,465,795 B1 | 10/2002 | Madonado et al. | |
| 6,511,897 B2 * | 1/2003 | Arima et al. | 438/460 |
| 6,606,234 B1 * | 8/2003 | Divakar | 361/234 |
| 6,665,168 B2 * | 12/2003 | Lin | 361/234 |
| 6,734,429 B2 | 5/2004 | Takagi | |
| 6,753,524 B2 | 6/2004 | Matsui et al. | |
| 7,123,350 B2 * | 10/2006 | Akutsu et al. | 355/72 |
| 7,408,760 B2 * | 8/2008 | Tanimoto et al. | 361/234 |
| 2007/0089672 A1 * | 4/2007 | Shimamura et al. | 118/504 |
| 2008/0100983 A1 * | 5/2008 | Purohit et al. | 361/234 |

* cited by examiner

*Primary Examiner* — Rexford Barnie
*Assistant Examiner* — Zeev V Kitov
(74) *Attorney, Agent, or Firm* — Sawyer Law Group, P.C.

(57) ABSTRACT

An apparatus for increasing electric conductivity to a wafer substrate when exposures to electron beam irradiation is disclosed. More specifically, a more free mechanical contact between a wafer and electric contact pins (within an electrostatic chuck) is provided to significantly reduce the scratch and damage on the wafer backside.

15 Claims, 7 Drawing Sheets

100

Needle type pin                    Ax type pin

APPARATUS FOR INCREASING ELECTRIC CONDUCTIVITY TO A SEMICONDUCTOR WAFER SUBSTRATE WHEN EXPOSURE TO ELECTRON BEAM

FIELD OF THE INVENTION

The present invention relates generally to an apparatus for increasing electric conductivity to a wafer substrate when exposed to electron beam irradiation. More specifically, the present invention relates to significantly reducing damage on the backside of a wafer substrate.

BACKGROUND OF THE INVENTION

During electron beam inspection or electron beam lithography process of the semiconductor device fabrication, the substrate surface, i.e. wafer surface, are irradiated with electron beam. If electric contact of the substrate or wafer is incomplete during irradiation of the electron beam onto an insulator film on the wafer, a charge-up of electrons occurs wherein electrons are accumulated on the interface between the wafer and the insulator film. The charging causes deflection of the electron beam during the irradiation thereof to deform the resultant pattern in the electron beam lithography process and the charge-up restrains the signal electrons emanating from the wafer surface thereof deform the image of surface in the electron beam inspection process.

There are many ways to prevent charge accumulation on wafer surface under electron irradiation. Control landing energy of the irradiating electrons, U.S. Pat. No. 6,734,429 of Takagi; eject rare gas molecules onto the wafer surface during electron irradiation, U.S. Pat. No. 6,465,795 of Madonado et al.; irradiate laser on the wafer surface simultaneously with electron irradiation, U.S. Pat. No. 6,753,524 of Matsui et al.; and the most common way utilize electric contact pins to conduct excess charge away, U.S. Pat. No. 6,068,964 of Komori. The electric contact pins make physical contact to the conductive layer on wafer backside (by means of mechanical punch through) or conductive path is formed between the pins and the conductive layer (by electrically breakthrough the insulator layer), stable potential can be obtained on the wafer conductive layer.

With a conventional electric contact pin housing design, the dimension of tolerance of the hole to let pin through is very tight. There is very little degree of freedom to let the pin move while the wafer slid in and the chucking force applied. Slide scratches within 20 to 30 micron level were found on the backside of wafer and became a particle source of other manufacturing processes. These slide scratches are believed scratched by the electric contact pin during the chucking and de-chucking process.

Accordingly, what is needed is a system and method to address the above-identified issues. The present invention addresses such a case.

SUMMARY OF THE INVENTION

This invention relates to an apparatus for increasing electric conductivity to a wafer substrate when exposures to electron beam irradiation. More specifically, a more free mechanical contact between a wafer and electric contact pins (within an electrostatic chuck) is provided to significantly reduce the scratch and damage on the wafer backside.

The embodiments of the present invention provide a plurality of electric contact pins that could be used to remove excessive charge with less back side scratch. Herein, the embodiments the shape of the electric contact pins is such that the contact area between the electric contact pin and the semiconductor is effectively increased to reduce scratch.

Other embodiments of the present invention provide some new distributions of electric contact pins, such that the damages induced by the scratch are decreased.

DETAILED DESCRIPTION OF THE INVENTION

The present invention relates generally to an apparatus for increasing electric conductivity to a wafer substrate when exposures to electron beam irradiation. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Reference will now be made in detail to specific embodiments of the invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Figure 1:
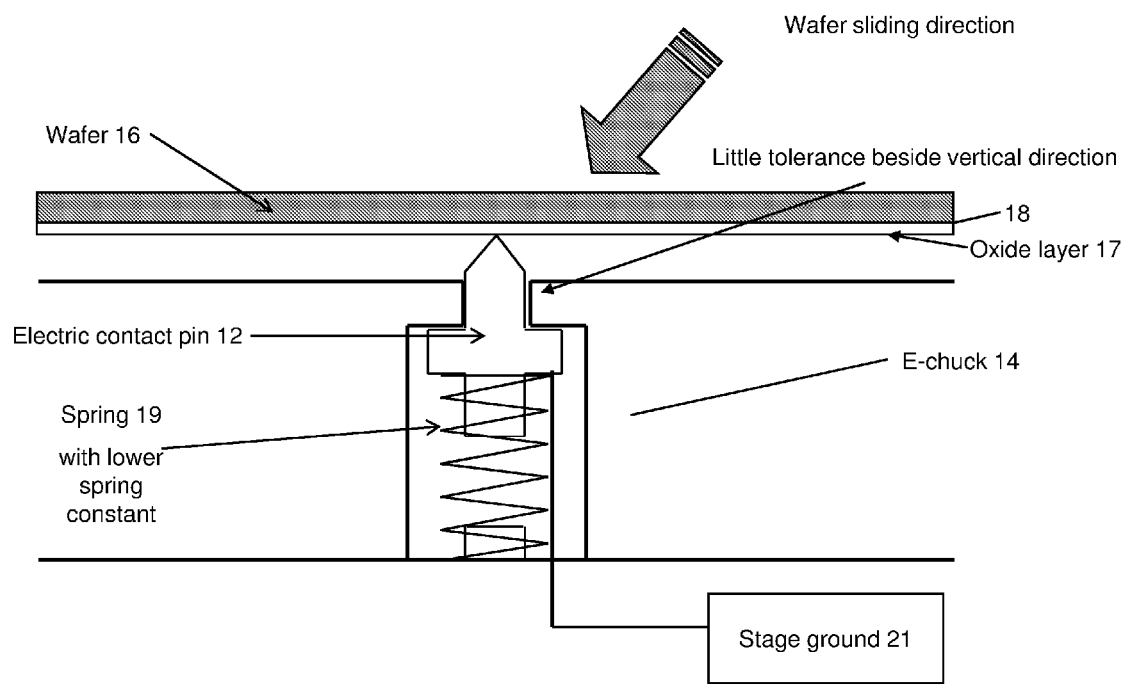
FIG. 1 is a diagrammatic representation of a conventional design of a electric contact pin within an electrostatic chuck before apply chucking force.
Figure 2:
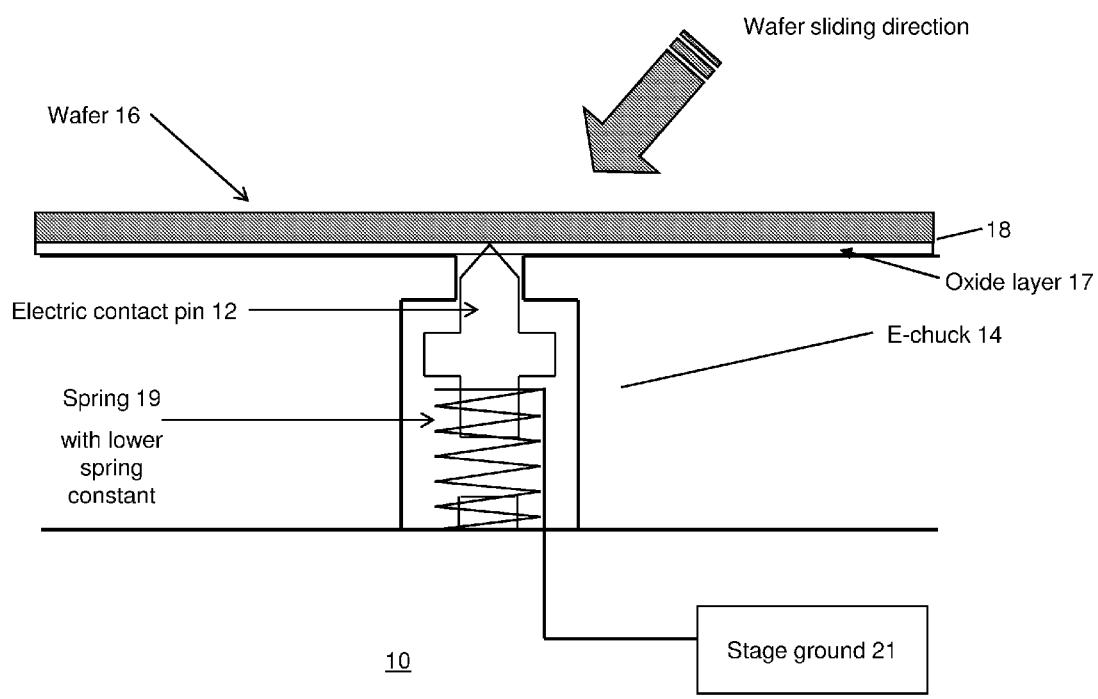
FIG. 2 is a diagrammatic representation of a conventional design of a electric contact pin within an electrostatic chuck under chucking force is applied.

In most of the semiconductor industry, a semiconductor device is manufactured on a single crystal silicon substrate surface. Silicon will act as a conductor under certain conditions; however, the backside surface of the wafer has a layer of silicon oxide which is built up during the manufacturing process. The silicon oxide is an electrical insulator. The accumulated oxide layer usually has a thickness around 700 to 800 nanometers; however, sometimes it may be as thick as 2000 angstrom (0.2 micron). A conventional way to remove excess charge accumulating on the wafer is conducting the charge through electric contact pin(s). In order to conduct the charge away, the electric contact pin(s) needs to punch through the insulating layer to reach the conducting silicon crystal. FIG. 1 is a diagrammatic representation of a conventional system 10 of an electric contact pin 12 in an electrostatic chuck housing 14 before apply chucking force. One of ordinary skill in the art recognizes that although only one pin 12 and one hole is shown with the chuck 14, a plurality of pins 12 and holes can be utilized therein. The system 10 includes a wafer 16 which is in contact with the pin 12 via an oxide layer 17. The system 10 further includes a spring 19 and is coupled to ground by stage ground 21. The wafer 16 is transferred onto the electrostatic chuck surface 14 by a robot (not shown). The electrostatic chuck 14 then applies chucking force to pull down and hold the wafer 16 on the electrostatic chuck surface 14. Meanwhile, the electric contact pin 12 make physical contact to the conductive layer 18 on backside of wafer 16 (by means of mechanical punch through) or conductive path is formed between the pin 12, for example, and the conductive layer 18 (by electrically breaking through the insulator layer 13), stable potential can be obtained on the conductive layer 18 as illustrated in FIG. 2.

With a conventional electric contact pin housing design, the dimension of tolerance of the hole to let pin through is very tight. There is very little degree of freedom to let the pin 12 move while the wafer 16 is slid in and the chucking force is applied. Slide scratches within 20 to 30 micron level were found on the backside of wafer 16 and became a particle source of other manufacturing processes. These slide scratches are caused by the movement of electric contact pin 12 during the chucking and de-chucking process.

Figure 3:
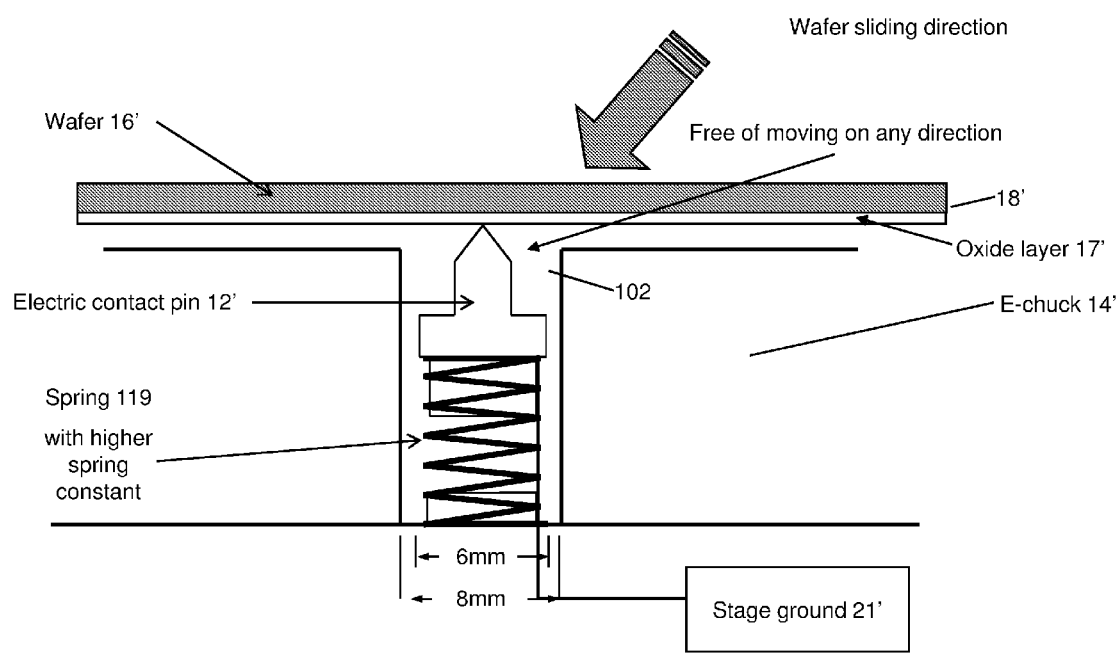
FIG. 3 is a diagrammatic representation of a free standing design of a electric contact pin within an electrostatic chuck before apply chucking force, according to an embodiment of the present invention.
Figure 3A:
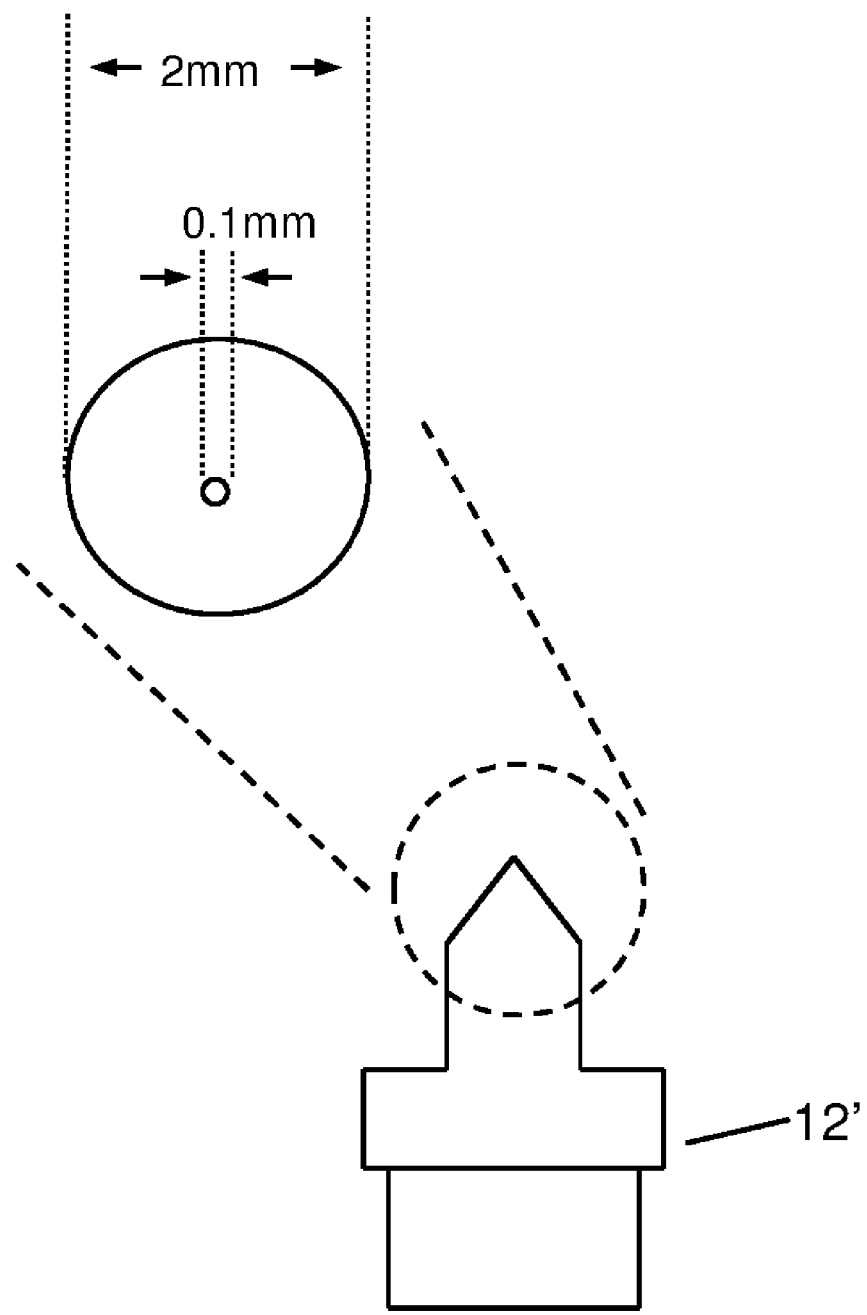
FIG. 3A is a top view of the contact pin.
Figure 4:
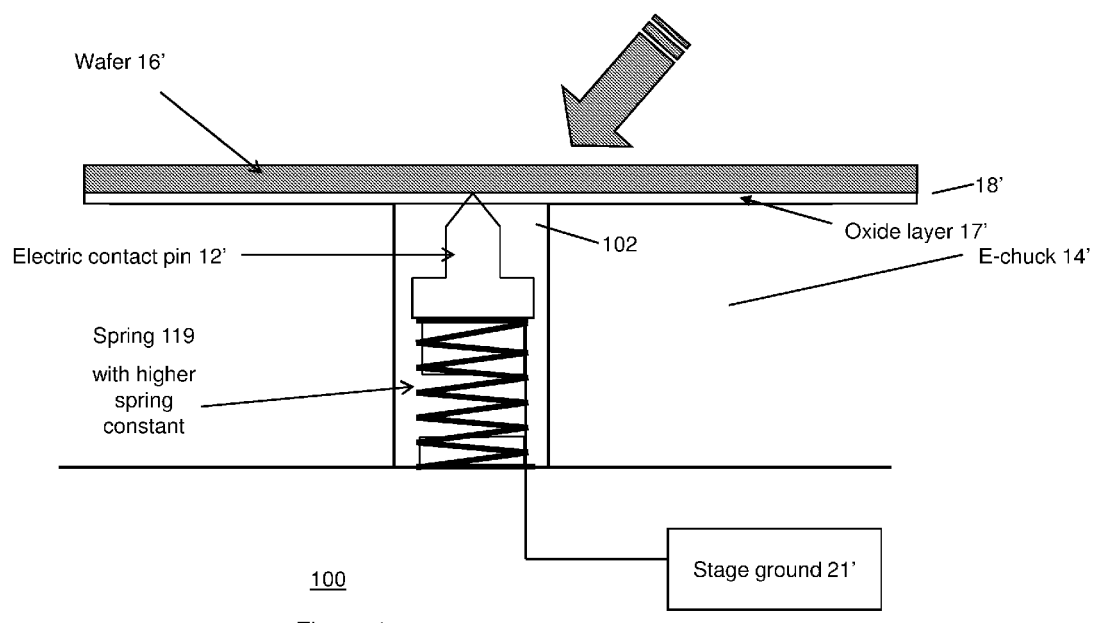
FIG. 4 is a diagrammatic representation of a free standing design of electric contact pin within an electrostatic chuck under chucking force is applied according to an embodiment of the present invention.

One embodiment to resolve the backside sliding scratches is to redesign the electric contact pin housing-hole. FIG. 3 is a diagrammatic representation of a free standing system 100 of one of the plurality of an electric contact pins within an electrostatic chuck before apply chucking force, according to an embodiment of the present invention. The wide open housing-hole opening 102 combined with a free standing electric contact pin 12 on a compression spring 119 has more direction free to move beside the downward direction while the electrostatic chuck 14 applies the chucking force. This compression spring 119 typically has a higher spring constant of spring 19 of FIGS. 1 and 2. A top view of the contact pin 12 is shown in FIG. 3A. As is seen in the Figure, in this embodiment, the width of pin is 2 mm while the width of the contact portion is 0.1 mm to form a needle pin design. The 360 degree free rotation of the free standing pin 12 releases the sliding stress from any direction that is induced during chucking and de-chucking process. FIG. 4 illustrates a free standing design of an electric contact pin for the electrostatic chucking 14 when the chucking force is applied.

Accordingly, an electric contact pin and an electrostatic chuck with a reconfigured pin housing hole form an apparatus for reducing charge density on a wafer. Herein, as disclosed by some embodiments, for each proposed pin housing hole, the opening of the pin housing hole is significantly wider than a corresponding portion of an electric contact pin located in a pin housing hole. For example, with a wide open housing-hole design, a 360 degree free rotation of the electric contact pin is provided. Of course, to achieve a 360 degree free rotation, the electric contact pin could be located on a spring. Moreover, the spring constant of the spring should be chosen to properly to control the motion of the electric contact pins to counteract the chucking and/or de-chucking force.

Figure 5:
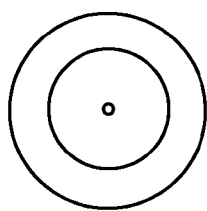
FIG. 5 is a simplified diagrammatic representation of some electric contact pin designs, according to an embodiment of the present invention.
Figure 5:
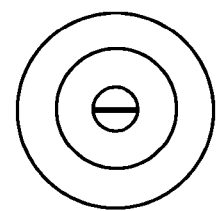
Figure 5:
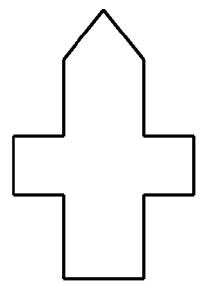
Figure 5:
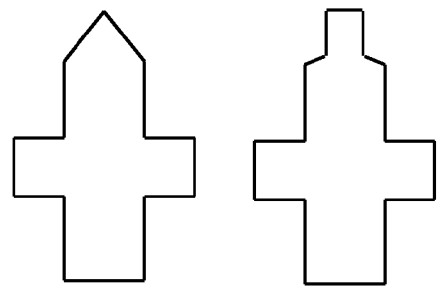

Other embodiments to resolve backside scratches is to redesign the shape of electric contact pin. FIG. 5 is a simplified diagrammatic representation of some electric contact pin designs, according to an embodiment of the present invention. The key of the embodiments is to increase the contact area between the electric contact pin and the wafer, such that the friction between the electric contact pin and wafer is increased and thus decreased the slide motion which produces sliding scratch. This could be achieved by using plateau pin top or round pin top to instead of the conventional sharpen needle type pin. This could also be achieved by using a pin with an ax shape tip instead a needle shape pin. The shape of the ax blade can penetrate through the oxide layer; however, the long blade ridge prevents the pin from sliding during chucking and de-chucking process that produces sliding scratch.

Figure 6:
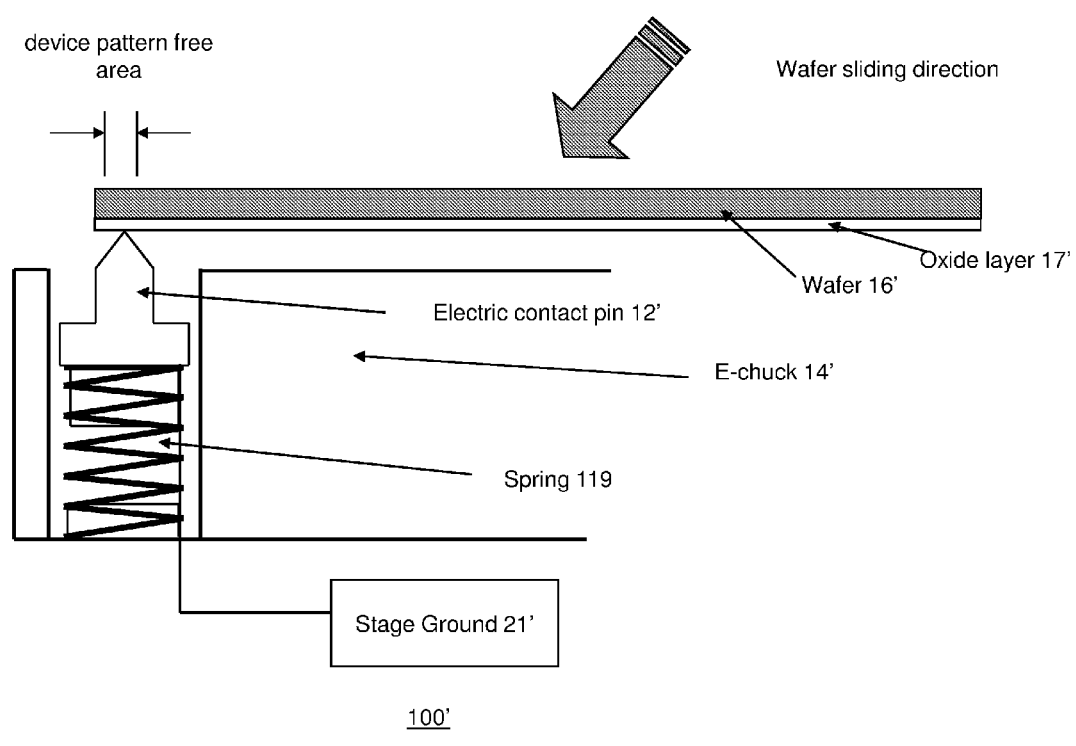
FIG. 6 is a simplified diagrammatic representation of a proposed electric contact pins distribution, according to an embodiment of the present invention.

The other embodiment proposed to minimize backside scratches is to distribute the pin housing holes, (i.e. these electric contact pins) in a different position. In the embodiment, the pin housing holes are positioned on a minor area of the electrostatic chuck 14. Herein, the minor area means that the corresponding area of the wafer has less device pattern. For example, the minor area could correspond to an edge of the wafer. Herein, an example is shown in FIG. 6 that the minor area is 1 to 3 millimeters from the wafer edge. However, it should be noticed that the size of the minor edge is adjustable, and it depends on many factors, such as wafer size, robot to move the wafer and so on. For example, the minor area could correspond to a pattern free area of the wafer, which means there is no pattern on the pattern free area. The minor area could also be a specific portion of the wafer that contains less critical device patterns on wafer, such as the pattern of conductive lines or the pattern of the dummy patterns.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An apparatus for increasing electric conductivity to a wafer substrate, comprising:
   an electrostatic chuck to hold a wafer, the electrostatic chuck having one or more pin housing holes; and
   one or more of electric contact pins individual corresponding to the pin housing holes;
   wherein, the opening of each pin housing hole is significantly wider than a corresponding portion of electric contact pin, such that the electric contact pins inside the pin housing holes can freely rotate to release sliding stress in all directions while the wafer substrate slides on the electrostatic chuck.

2. The apparatus as claimed in claim 1, wherein the opening is significantly wider than a narrower tip of electric contact pin when the electric contact pin has a wider base and a narrower tip.

3. The apparatus as claimed in claim 1, wherein the opening is wider than the wider base of electric contact pin when the electric contact pin has a wider base and a narrower tip.

4. The apparatus as claimed in claim 1, each the electric contact pin is electrically coupled a stage ground.

5. An apparatus for increasing electric conductivity to a wafer substrate, comprising:

an electrostatic chuck to hold said wafer, the electrostatic chuck having a plurality pin housing holes that locate on a minor area of the electrostatic chuck;

one or more of electric contact pins individually corresponding to said pin housing holes; and one or more of compressing springs individually coupled to the electric contact pins for providing more directions freely to move while the electrostatic chuck is applying chucking force to the wafer substrate.

6. The apparatus as claimed in claim 5, wherein the minor area corresponds to an edge of a wafer.

7. The apparatus as claimed in claim 5, wherein the minor area corresponds to a pattern free area of a wafer.

8. The apparatus as claimed in claim 5, wherein the minor area corresponds to a specific portion of said wafer, the specific portion containing less critical device patterns on a wafer.

9. The apparatus as claimed in claim 5, each electric contact pin is electrically coupled to a stage ground.

10. The apparatus as claimed in claim 1, wherein the electric contact pins are non-needle type tip.

11. The apparatus as claimed in claim 10, wherein the non-needle type pin is an ax shape with blade ridge.

12. The apparatus as claimed in claim 10, wherein said electric contact pins are electrically coupled to a stage ground.

13. The apparatus as claimed in claim 10, wherein the non-needle type pin has a rounded top.

14. The apparatus as claimed in claim 1, further comprising one or more of compressing springs individually coupled to the electric contact pins for providing more directions free to move while the electrostatic chuck applying chucking force.

15. The apparatus as claimed in claim 14, wherein the compressing springs are electrically coupled to a stage ground.

* * * * *